United States Patent [19]
Hayden et al.

[11] Patent Number: 5,371,026
[45] Date of Patent: Dec. 6, 1994

[54] METHOD FOR FABRICATING PAIRED MOS TRANSISTORS HAVING A CURRENT-GAIN DIFFERENTIAL

[75] Inventors: James D. Hayden; James R. Pfiester; Hsing-Huang Tseng, all of Austin, Tex.

[73] Assignee: Motorola Inc., Schaumburg, Ill.

[21] Appl. No.: 983,347

[22] Filed: Nov. 30, 1992

[51] Int. Cl.$^5$ ............................................. H01L 21/265
[52] U.S. Cl. ........................................ 437/41; 437/29; 437/44; 437/52; 437/45
[58] Field of Search .................. 148/DIG. 53; 437/41, 437/44, 52, 29

[56] References Cited

U.S. PATENT DOCUMENTS

| | | | |
|---|---|---|---|
| 4,814,841 | 3/1989 | Maanoka et al. | 257/903 |
| 5,057,893 | 10/1991 | Sheng et al. | |
| 5,093,275 | 3/1992 | Tasch, Jr. et al. | 437/41 |
| 5,208,175 | 5/1993 | Choi et al. | 437/43 |

OTHER PUBLICATIONS

Tseng, H., et al., "Advantages of CVD Stacked Gate Oxide For Robust 0.5 μm Transistors" IEDM Technical Digest, 1991, pp. 75–78.
Ohkubo, H., et al., "16 Mbit SRAM Cell Technologies for 2.0 V Operation" IEDM Technical digest, 1991, pp. 481–484.
Pfiester, J., et al, "Poly–Gate Sidewall Oxidation Induced Submicrometer MOSFET Degradation" IEEE Electron Dev. Letters, (10), No. 8, Aug. 1989, pp. 367–369.

Primary Examiner—Olik Chaudhuri
Assistant Examiner—H. Jep Tsai
Attorney, Agent, or Firm—Jasper W. Dockrey

[57] ABSTRACT

A semiconductor device (10) and process provides first and second, electrically coupled MOS transistors (14, 16) in which the current gain of the second MOS transistor (16) is greater than the current gain of the first MOS transistor (14). First and second gate structures (23, 25) are formed on a gate dielectric layer (26) overlying a semiconductor substrate (12). The gate dielectric layer (26) has a uniform thickness in all regions. The current gain differential between the first and second MOS transistors (14, 16) is obtained by selectively forming a dielectric intrusion layer (42) under the gate structure (23) of the first MOS transistor (14), whereas the dielectric layer (26) underlying the gate structure (25) of the second MOS transistor (16) retains the uniform thickness. The dielectric intrusion layer (42) causes a higher channel resistance in the first MOS transistor (14) which retards the current gain in the first MOS transistor (14) relative to the current gain of the second MOS transistor (16).

9 Claims, 3 Drawing Sheets

METHOD FOR FABRICATING PAIRED MOS TRANSISTORS HAVING A CURRENT-GAIN DIFFERENTIAL

FIELD OF THE INVENTION

This invention relates in general to semiconductor devices and to methods of fabrication, and more particularly to a semiconductor device, wherein paired MOS transistors have a current-gain differential, and to methods for the fabrication of the device.

BACKGROUND OF THE INVENTION

In many VLSI integrated circuit devices, there is a need to fabricate transistors that have different electrical performance characteristics. For example, SRAM cells suffer stability problems as the cell size is reduced. To function properly, the SRAM memory cell, when charged, must hold a voltage level, either high (logic 1) or low (logic 0). When reading data from the cell, the charge pulse generated as the pass transistor turns on must not flip the voltage level at the storage nodes. To stabilize the cell, the driver transistors are fabricated to have a higher current gain than the pass transistors. Usually, the current gain relationship is controlled by adjusting the width-to-length (W/L) ratio of the driver transistors relative to that of the pass transistors. The ratio of the W/L values of the two sets of transistors is known as the cell ratio and is commonly specified to be at least 3.0 or larger.

The physical adjustment of the W/L ratio for an MOS transistor requires a dimension change in either the width or the length of the gate electrode. In a VLSI circuit, where component sizes are typically reduced as much as possible, a constraint is placed on the maximum dimension of both the width and the length of the gate electrodes used in a circuit. This constraint limits the ability of a circuit designer to affect a parameter, such as the cell ratio. The cell designer is not free to arbitrarily select large values for one dimension relative to the other dimension in order to achieve the desired W/L ratio.

Recognizing a need to control the performance characteristics of one MOS transistor relative to that of another by means other than changing physical dimensions of the gate, technologists have developed other methods to control transistor performance characteristics. In one method, the control of the current gain of a pass transistor relative to a driver transistor is achieved by changing the doping concentration in a source-drain region. The gain of the pass transistor is reduced by omitting the N+source region when forming the pass transistor. While this method is effective in changing current gain, the alteration of the source electrical field relative to the drain electric field can result in asymmetric behavior and poor overall performance. In another method, the thickness of the gate dielectric is increased in one set of transistors relative to the thickness of the gate dielectric of the other set of transistors. For example, the thickness of the gate dielectric layer is made thicker in the pass transistors relative to the gate dielectric thickness in the driver transistors. The pass transistors each having the thicker gate dielectric layer have a lower current gain than the driver transistors. While changing the dielectric thickness is effective is altering current gain, additional high-precision processing steps are necessary to obtain an exact dielectric thickness differential between the two sets of transistors.

Although the techniques described above overcome the limitations inherent in adjusting the dimensions of a gate electrode in a VLSI circuit, still more exact control of the current-gain parameter is needed to meet the demands of ever smaller circuit designs. In achieving a desired current gain differential, the method used must not result in abnormal transistor performance, such as asymmetric performance characteristics, and must be readily manufacturable.

SUMMARY OF THE INVENTION

In practicing the present invention, there is provided a semiconductor device structure and fabrication process which enables the current gain of a selected MOS transistor to be adjusted relative to that of another MOS transistor. In one embodiment, first and second electrically coupled MOS transistors are provided in which the first MOS transistor has a dielectric layer having a relatively thick portion underlying the edge of the gate electrode, and a relatively thin portion underlying the central region of the gate electrode. The dielectric layer of the second MOS transistor has a uniform thickness under all portions of the overlying gate electrode. The current gain of the second MOS transistor is greater than the current gain of the first MOS transistor.

A process for fabricating the device includes the step of providing a semiconductor substrate having a gate dielectric layer overlying the substrate. The gate dielectric layer is everywhere uniformly thick. First and second MOS gate electrodes are formed on the gate dielectric layer. The first and second MOS gate electrodes are parts for first and second MOS transistors, respectively, that are electrically coupled to each other. Each gate electrode has a conductive body having a wall surface, a central region, and a bottom surface. A dielectric intrusion layer is formed under the first gate electrode. The dielectric intrusion layer has a relatively thick portion underling the conductive body at the wall surface, and tapers to a point at the bottom surface of the first conductive body, such that the total dielectric thickness underlying the central region of the first conductive body is equal to the uniform thickness of the dielectric layer.

BRIEF DESCRIPTION OF THE DRAWINGS

FIGS. 2-1 to 2-2, illustrate, in cross-section, process steps in accordance with an alternate embodiment of the invention; and FIGS. 3-1 to 3-2, illustrate, in cross-section, process steps in accordance with a second alternate embodiment of the invention.

Figure 1:
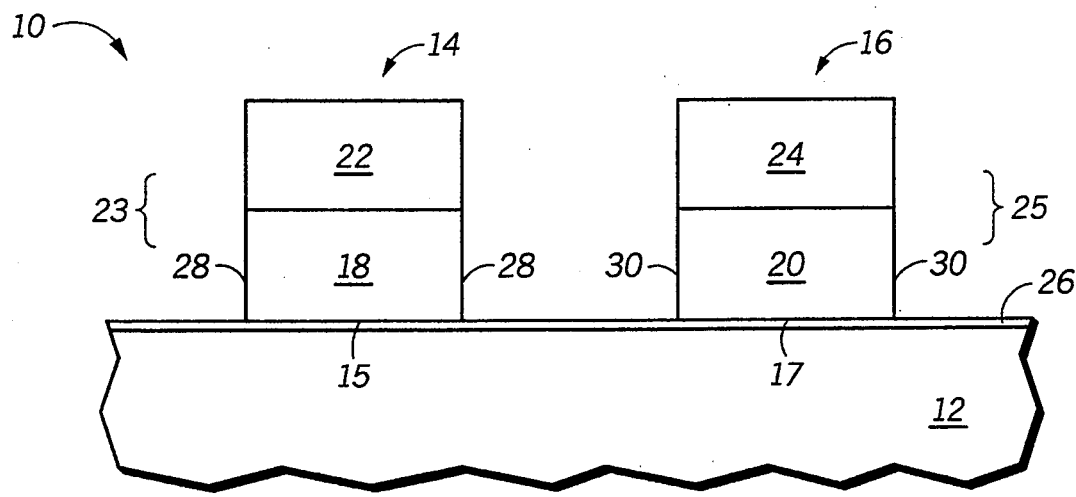
FIGS. 1-1 to 1-5, illustrate, in cross-section, process steps in accordance with one embodiment of the invention.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

This invention provides a device structure and method for fabricating a device in which two MOS transistors are electrically coupled, and wherein one of the two transistors has a higher current gain. The structure and process of the present invention obtain the gain relationship without utilizing a large amount of substrate surface area. Paired MOS transistors having a current gain differential can be advantageously employed in many different integrated circuit devices. For example, in SRAM devices, the pass transistors which control bit-line access to the driver transistors must not generate as much drive current as the driver transistors. Depending upon the particular configuration and sequence of photomasking layers, the device and process of the present invention can be used as an integral part of a complete process further employing additional process steps to fabricate other MOS devices, such as a DRAM device, a microprocessor device, a Bi-CMOS device, or the like.

Shown in FIG. 1-1, in cross-section, is a semiconductor device 10 having already undergone some of the process steps. A semiconductor substrate 12 supports a first MOS transistor 14 and a second MOS transistor 16. Transistors 14 and 16 each include a first and second conductive bodies 18 and 20, respectively, and an overlying insulating layer 22 and 24, respectively. First conductive body 18 and insulating layer 22 form a first insulated gate electrode 23. Similarly, second conductive body 20 and insulating layer 24 form a second insulated gate electrode 25. A dielectric layer 26 separates conductive bodies 18 and 20 from substrate 12. An interface 15 is defined between conductive body 18 and dielectric layer 26, and an interface 17 is defined between conductive body 20 and dielectric layer 26. Dielectric layer 26 is uniformly thick everywhere.

For purposes of illustrating the invention, substrate 12 is a P-type semiconductor material, and conductive bodies 18 and 20 are a N-type material and act as the gate electrodes for the pass and driver transistors, respectively, that are subsequently formed. However, those skilled in the art recognize that the conductivity can be reversed from that illustrated. Conductive bodies 18 and 20 can be an oxidizable semiconductor material such as polysilicon, or a polysilicon-refractory metal silicide composite material. Alternatively, conductive bodies 18 and 20 can be a refractory metal silicide, such as tungsten, titanium, molybdenum, or the like. Insulation layers 22 and 24 are preferably silicon oxide formed by chemical vapor deposition.

In one embodiment of the invention, dielectric layer 26 is a thermal oxide layer formed by oxidizing the surface of substrate 12. Alternatively, dielectric layer 26 can be a composite layer, which includes a thermal oxide layer overlying the surface of substrate 12, and a chemical vapor deposited (CVD) oxide layer overlying the thermal oxide layer. In yet another alternative, dielectric layer 26 can be a single CVD oxide layer deposited onto substrate 12. As will subsequently be described, either the composite layer or the single CVD oxide layer provides an enhancement to the selective oxidation process of the present invention, which is described below.

Preferably, first and second insulated gate structures 23 and 25 are formed by the sequential formation of a layer of doped polysilicon, followed by the deposition of a layer of silicon oxide onto the polysilicon. The polysilicon layer is preferably formed by chemical vapor deposition and can be doped with a N-type dopant, such as arsenic or phosphorus, either during deposition, or afterward. The silicon oxide layer can also be formed by chemical vapor deposition, or alternatively, by a spin-on glass (SOG) technique. As used in this specification, the term "gate structure" includes a gate electrode and any layer above or below the gate electrodes that has a pattern with edges that are substantially coincident with the edges of the underlying or overlying gate electrode at any particular location on the substrate. For example, referring to FIG. 1-1, first gate structure 23 includes the first conductive body 18, which acts as a gate electrode, and the insulating layer 22. If the insulating layer 22 would be removed, then the first gate structure 23 only includes the first conductive body 18. After depositing the layers, a photomask is formed on the silicon oxide layer and an anisotropic etch is performed to etch both the silicon oxide layer and the underlying polysilicon layer. The directional characteristics of the anisotropic etch form vertical wall surfaces 28 and 30 as shown in FIG. 1-1.

Figures 1, 2:
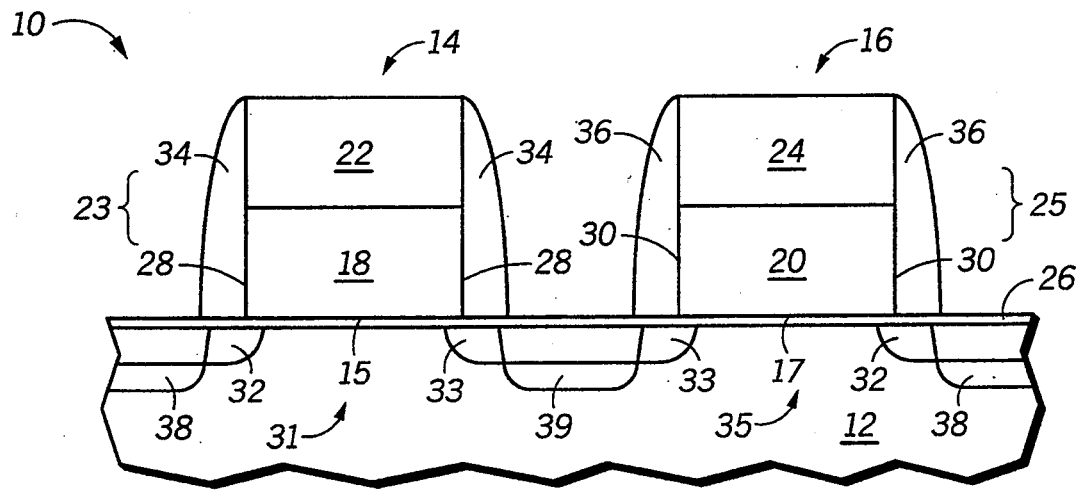

After forming first and second insulated gate structures 23 and 25, lightly-doped source and drain regions 32 and 33, respectively, are formed in substrate 12, as shown in FIG. 1-2. Preferably, source and drain regions 32 and 33 are formed by ion implantation of a N-type dopant using gate structures 23 and 25 as an implant mask. Source and drain regions 32 and 33 are separated by a channel region 31 residing in substrate 12 beneath conductive body 18 and by a channel region 35 residing in substrate 12 beneath conductive body 20.

Next, sidewall spacers 34 and 36 are formed on first and second gate structures 23 and 25, respectively. Sidewall spacers 34 and 36 are formed by depositing an insulating material, preferably silicon nitride, onto gate structures 23 and 25. The insulating material is then anisotropically etched to form the sidewall spacers. The directional characteristics of the anisotropic etch remove all portions of the insulating material except that which lies adjacent to vertical surfaces, such as wall surfaces 28 and 30.

Once sidewall spacers 34 and 36 are in place, heavily-doped source and drain regions 38 and 39, respectively, are formed using the sidewall spacers as a doping mask. Preferably, source and drain regions 38 and 39 are formed by ion implantation of a N-type dopant. In an alternative method, source and drain regions 38 and 39 can be formed by diffusion of a dopant from a gaseous source, or by molecular beam deposition, or the like. After introducing the dopant into substrate 12, an annealing process is carried out to activate the dopant atoms. The annealing process also causes the dopant atoms in lightly-doped regions 32 and 33 laterally diffuse in substrate 12, such that lightly-doped regions 32 and 33 underlie the edges of conductive bodies 18 and 20.

Figures 1, 2, 3:
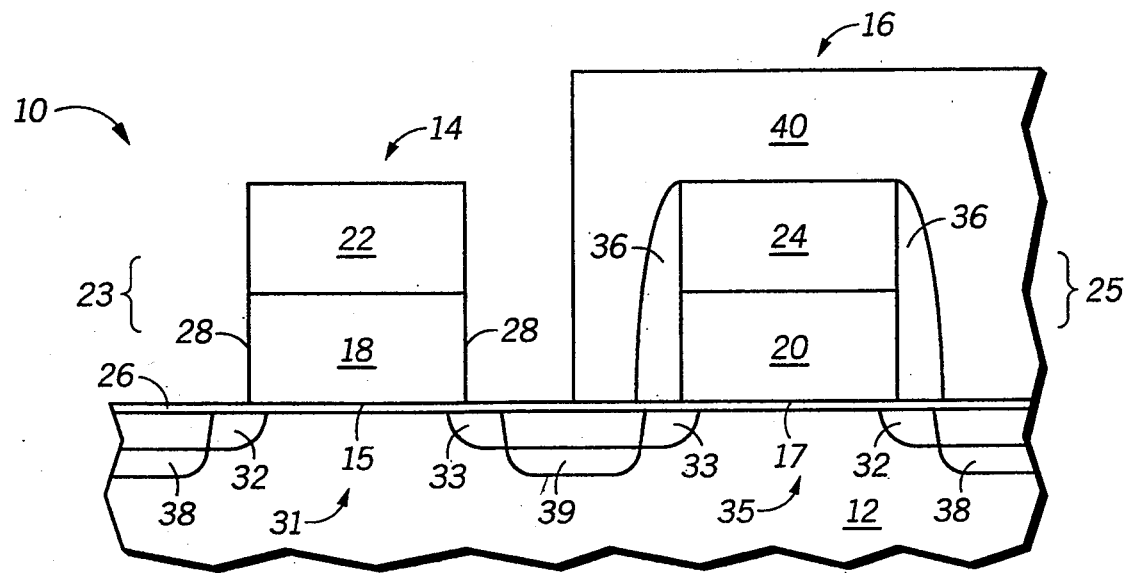
Figures 1, 2, 3, 4:
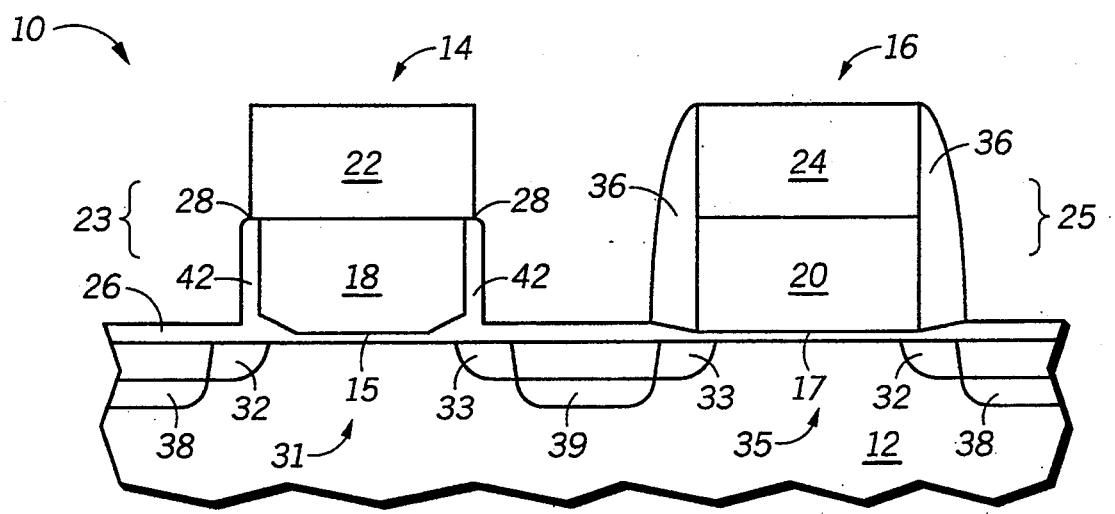
Figures 1, 2, 3, 4, 5:
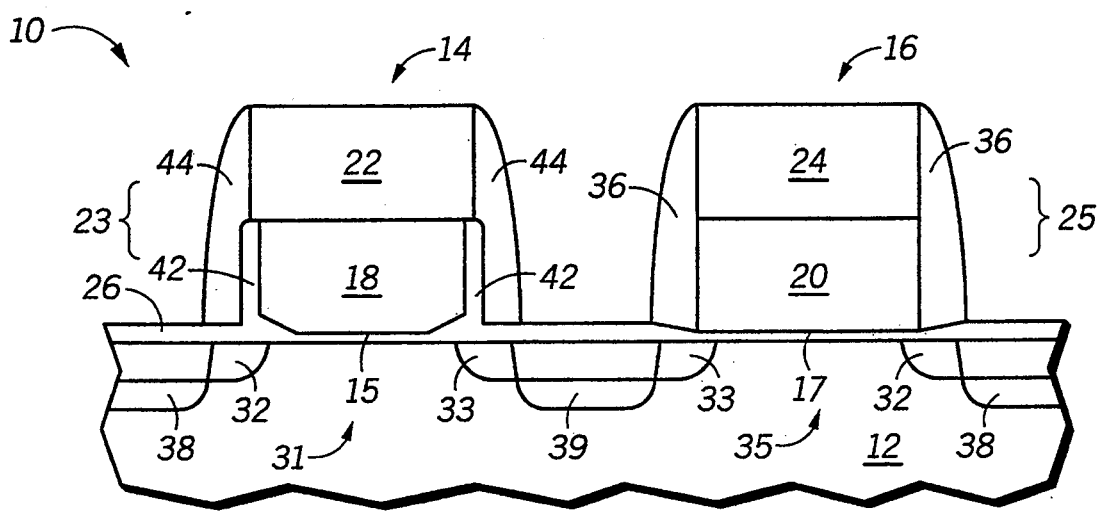
Figures 1, 2:
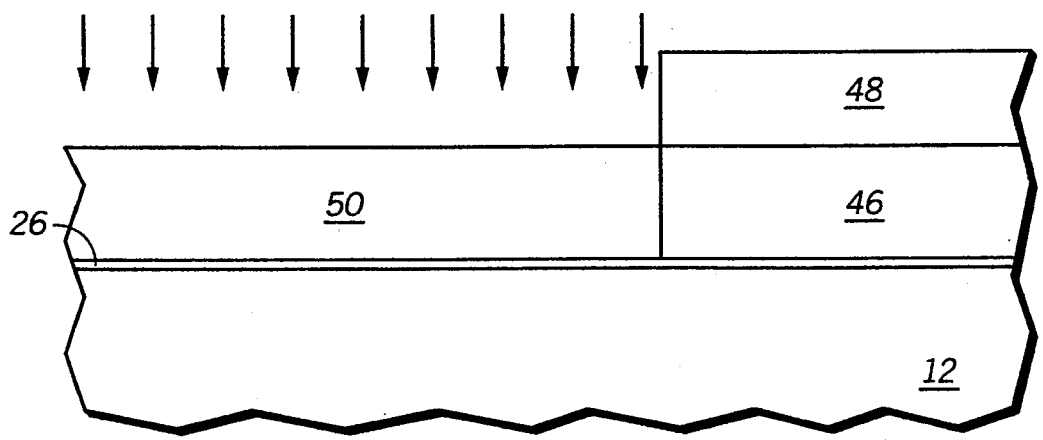
Figure 2:
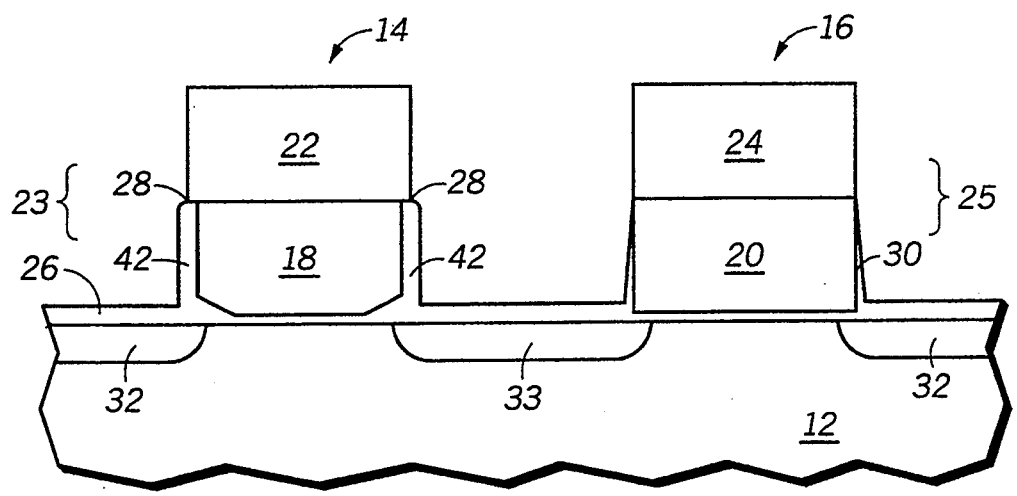
Figures 1, 3:
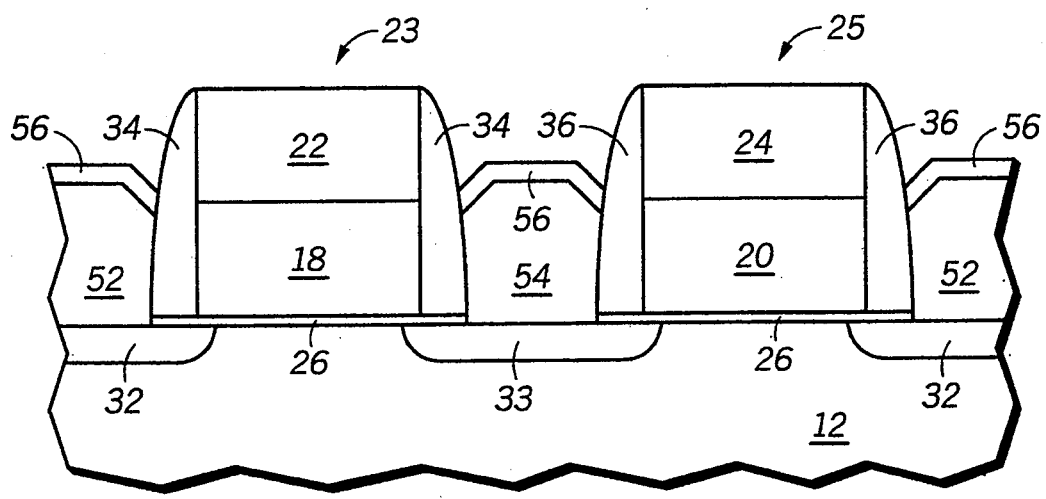
Figures 2, 3:
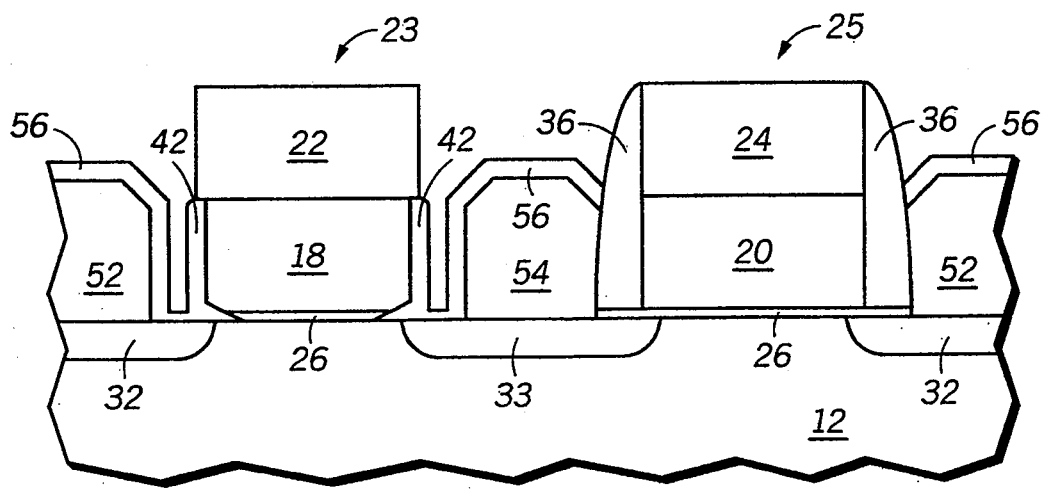

Following the formation of the lightly-doped and heavily doped source and drain regions, a photomask 40 is formed over second gate structure 25 and sidewall spacer 34 is etched away, as illustrated in FIG. 1-3. Preferably, sidewall spacer 34 is removed by plasma etching in a down-stream etching apparatus. The down-stream etching system produces activated etchant species in a high-intensity, RF field. The activated etchant species are then transported to a remote etching chamber, which is located away from the electric field. The material to be etched is placed in the remote etch chamber and the activated etching species isotropically etches the material. In a preferred processing method, a plasma etch process is used to isotropically etch sidewall spacer 34. Alternatively, sidewall spacer 34 can be isotropically etched in a conventional, wet etching process using a phosphoric acid based etching solution.

After removing sidewall spacer 34, photomask 40 is also removed, and a controlled oxidation process is carried out to selectively form a dielectric intrusion layer 42, as shown in FIG. 1-4. Intrusion layer 42 is formed by the selective oxidation of conductive body 18 at interface 15, and to a lesser extent, by the oxidation of substrate 12. It is important to note that sidewall spacer 36 substantially prevents oxidation from occurring at interface 17. Intrusion layer 42 is only formed at interface 15 and on sidewall 28. Intrusion layer 42 lies adjacent to wall surface 28, and also extends a predetermined distance along interface 15 from wall surface 28 toward the central region of conductive body 18. The oxidation process is controlled such that intrusion layer 42 only penetrates to a predetermined distance along interface 15. Intrusion layer 42 does not lie under all of the conductive body 18, nor does it completely separate conductive body 18 from substrate 12. After intrusion layer 42 is completely formed, the total dielectric thickness underlying the central region of first conductive body 18 remains about the same thickness as the thickness of the dielectric layer 26 as originally formed.

In an alternative method, intrusion layer 42 is formed on only one side of first gate structure 23. Photomask 40 is formed over second gate structure 16 and a portion of sidewall spacer 34 adjacent to second gate structure 25. Then, the portion of sidewall spacer 34 overlying lightly-doped source region 32 is etched away. During the oxidation process used to form intrusion layer 42, the remaining portion of sidewall spacer 34 prevents the formation of intrusion layer 42 over lightly-doped drain region 33. The formation of intrusion layer 42 on a single side of first gate structure 23 further refines the degree of increased channel resistance created by intrusion layer 42.

Preferably, the oxidation process used to form intrusion layer 42 is performed in a dry thermal oxidation furnace using oxygen gas. The oxidation process is controlled by first determining the oxidation rate at a given oxidation temperature and oxygen flow rate. Once the oxidation rate is known, the oxidation process is then carried out for a predetermined time. Those skilled in the art appreciate that the exact material composition and dopant concentration of both first conductive body 18 and substrate 12 also affect the rate of oxidation. Accordingly, the oxidation process is characterized by a given set of process parameters and the physical characteristics of the material to be oxidized.

Additional control of the penetration distance of intrusion layer 42 along interface 15 is obtained when dielectric layer 26 is a thermal oxide/CVD-oxide composite layer. As previously described, a composite dielectric layer is formed by depositing a CVD-oxide layer onto an oxide layer previously formed by the thermal oxidation of substrate 12. Also as previously described, dielectric layer 26 can be a CVD-oxide layer deposited directly onto substrate 12. Once deposited, the density of the CVD-oxide is increased to a desired level. The CVD-oxide densification process is a thermal treatment carried out in an oxygen ambient. The CVD-oxide, when deposited, is said to be, "undensifted."

Following deposition, the density of the CVD-oxide can be increased by increasing either the furnace temperature or the oxygen concentration, or both. When the density of the CVD-oxide reaches its maximum, which is near the density of thermally grown oxide, the CVD-oxide is said to be "fully densified." When the density of the CVD-oxide is between the density of the as-deposited CVD-oxide and the maximum density of the CVD-oxide, the CVD-oxide is said to be "partially densified."

The distance that intrusion layer 42 penetrates under conductive body 18 can be regulated by varying the degree to which the CVD-oxide layer is densified after deposition. For example, when the CVD-oxide is fully densified, the oxidation rate of both conductive body 18 at interface 15 and substrate 12 is suppressed. The effective oxidation rate approaches the oxidation rate attained when dielectric layer 26 is a single, thermally-grown oxide layer. Conversely, when the CVD-oxide is only partially densified, the oxidation rate at interface 15 increases. Increasing the oxidation rate of conductive body 18 and substrate 12 increases the penetration distance of intrusion layer 42 along interface 15.

The presence of intrusion layer 42, under the edge of gate structure 23, will reduce the current gain of MOS transistor 14 relative to MOS transistor 16. In general, the current gain refers to the amount of electrical current passing through the transistor for a given voltage difference between gate structure and the source region. Referring to FIG. 1-4, the thick oxide portion of intrusion layer 42 separates lightly-doped source and drain regions 32 and 33 from first conductive body 18 at wall surface 28. The dielectric layer underlying first conductive body 18 is contoured. The large separation distance between first conductive body 18 and substrate 12 at wall surface 28, relative to the separation distance between the central region of first conductive body 18 and substrate 12, produces a high channel resistance in transistor 14. First conductive body 18 is not able to invert the portion of channel region 31 underlying wall surface 28 to the same extent as the portion of channel region 31 underlying the central region of conductive body 18. This is because intrusion layer 42 separates the gate structure from the substrate at wall surface 28. The nonuniform inversion layer in channel region 31 functions to increase the electrical resistance of the channel. Accordingly, the high channel resistance reduces the amount of electrical current which can pass through transistor 14 when transistor 14 is turned on. It follows that the reduction in the amount of electrical current flowing through the transistor reduces the current gain of the transistor.

After forming intrusion layer 42, gate structure 23 is again electrically isolated by forming a second sidewall spacer 44 on wall surface 28, as illustrated in FIG. 1-5. Second sidewall spacer 44 seals intrusion layer 42 to wall surface 28 and protects intrusion layer 42 from possible damage by subsequent process steps. Preferably, second sidewall spacer 44 is an insulating material which is differentially etchable with respect to dielectric layer 26. For example, when dielectric layer 26 is silicon dioxide, a CVD-oxide layer, or a thermal oxide-CVD-oxide composite layer, second sidewall spacer 44 is formed with silicon nitride. In a manner consistent with the level of skill in the art to which the present invention pertains, further process steps are carried out, in accordance with the present invention, to complete the fabrication of an integrated circuit device.

An alternative process embodiment is illustrated, in cross section, in FIGS. 2-1 and 2-2. In the alternative embodiment, a layer of gate-electrode forming material 46, is deposited onto dielectric layer 26. Material layer 46 is an electrically conductive material such as doped polysilicon, polysilicon-refractory metal silicide, refractory metal, and the like. Material layer 46 is doped with an N-type dopant either during deposition or immediately afterward. Once material layer 46 is formed, the oxidation characteristics of material layer 46 are altered by forming a doping mask 48 and selectively doping an unmasked portion 50 of material layer 46. Unmasked portion 50 is further heavily doped with an N-type dopant such as arsenic or phosphorus. The selective doping procedure produces a differential doping concentration in material layer 46. The dopant is selectively introduced into material 46 to alter the oxidation characteristics of the material. For example, in regions where the doping concentration is high, such as portion 50, the oxidation rate of material layer 46 is proportionally higher than in regions where the doping concentration is low.

After differentially doping material layer 46, conductive bodies 18 and 20, and insulating layers 22 and 24 are formed as previously described. The photomasking and etching steps are carried out such that conductive body 18 is formed from portion 50 of material layer 46. Conductive body 20 is formed from the masked portion of material layer 46. In the alternative embodiment, intrusion layer 42 is selectively formed on conductive body 18 in the absence of an oxidation mask. The structure shown in FIG. 2-2 is subjected to a thermal oxidation process. During oxidation, the large dopant concentration in conductive body 18 causes an elevated oxidation rate in conductive body 18 relative to the oxidation rate of conductive body 20. As depicted in FIG. 2-2, the differential oxidation rate forms intrusion layer 42 on conductive body 18, while conductive body 20 is only a slightly oxidized. Lightly-doped source and drain regions 32 and 33 are formed prior to oxidation using the previously described processing methods.

In accordance with the procedures previously described, the structure shown in FIG. 2-2 is further processed to form sidewall spacers adjacent to insulated gate structures 23 and 25 and to form heavily-doped source and drain regions aligned to the sidewall spacers. Once these steps are performed, the structure appears similar to that shown in FIG. 1-5. The alternate process embodiment illustrated in FIGS. 2-1 and 2-2 has the advantage of a relatively simple process sequence. By relying on the differential oxidation rate, the step of forming a temporary sidewall spacer is eliminated.

A second alternate process embodiment is illustrated, in cross-section, in FIGS. 3-1 and 3-2. In the second alternative embodiment, elevated source and drain regions 52 and 54 are formed on either side of insulated gate structures 23 and 25. Insulated gate structures 23 and 25, sidewall spacers 34 and 36, and lightly-doped source and drain regions 32 and 33 are formed in accordance with the previously described process. Following the formation of sidewall spacers 34 and 36, portions of dielectric layer 26 adjacent to insulated gate structures 23 and 25 are etched away to expose the surface of substrate Next, elevated source and drain regions 52 and 54 are formed by an epitaxial deposition process. In a preferred embodiment, elevated source and drain regions 52 and 54 are epitaxial silicon. In the epitaxial deposition process, the deposition reaction is adjusted so that the silicon is deposited only on the exposed substrate, which acts as a nucleation site for the deposition. Once the epitaxial deposition begins on a nucleation site, the deposited silicon itself acts as a nucleation site so that the reaction continues depositing successive layers of silicon eventually forming a thick layer. The epitaxially deposited silicon does not otherwise deposit on oxides or other dielectric materials. Once the elevated source and drain regions are formed, an oxidation process is carried out to form an oxide layer 56 on the surface of the epitaxial silicon.

Next, a photomask is formed over insulated gate structure 25 and sidewall spacer 34 is etched away. An oxidation process is then used to form intrusion layer 42, as illustrated in FIG. 3-2. The process of the second alternate embodiment then continues with the formation of second sidewall spacer 44 as previously described.

The formation of elevated source and drain regions 52 and 54 has the advantage of providing a more uniform surface topography. In accordance with the invention, subsequent processing of the MOS transistors includes forming passivation layers and metal interconnects. Those skilled in the art appreciate that a more reliable metallization process can be realized when the surface topography is devoid of large steps over which metal leads must traverse.

Thus it is apparent that there has been provided, in accordance with the invention, a semiconductor device and fabrication process which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, different annealing and densification process can be used, such as rapid thermal annealing, and laser annealing, and the like. It is therefore intended to include within the invention all such variations and modifications as fall within the scope of the appended claims and equivalents thereof.

We claim:

1. A process for fabricating a semiconductor device comprising the steps of:
   providing a semiconductor substrate having a gate dielectric layer thereon, the gate dielectric layer having a uniform thickness;
   providing first and second electrically coupled MOS gate electrodes, each MOS gate electrode having a conductive body, wherein the conductive body has a wall surface, a central region, and a bottom surface;
   forming sidewall spacers adjacent to the conductive body of the second MOS gate electrode; and
   oxidizing the conductive body of the first MOS gate electrode to form a dielectric intrusion layer under the first MOS gate electrode,
   wherein the intrusion layer includes a portion having a first thickness underlying the conductive body at the wall surface,
   wherein the first thickness is greater than the uniform thickness, and
   wherein the intrusion layer tapers to a point at the bottom surface such that the total dielectric thickness underlying the central region of the conductive body is equal to the uniform thickness.

2. The process of claim 1, wherein the step of forming sidewall spacers comprises:
   depositing a layer of silicon nitride overlying the first and second gate electrodes;
   anisotropically etching the silicon nitride layer to form sidewall spacers adjacent to the first and second gate electrodes;
   forming a photoresist layer overlying the second gate structure; and
   etching away the sidewall spacer adjacent to the first gate electrode.

3. The process of claim 1 further comprising the step of differentially implanting an N-type dopant into the conductive body of the first MOS gate electrode prior to oxidizing.

4. The process of claim 1 further comprising:
   depositing a layer of silicon oxide overlying the gate dielectric layer; and
   thermally annealing the deposited oxide layer to at least partially densify the oxide layer.

5. A process for fabricating a semiconductor device comprising the steps of:
   providing a semiconductor substrate having a gate dielectric layer thereon, wherein the gate dielectric layer is comprised of at least one layer of chemical vapor deposited silicon dioxide;
   densifying the gate dielectric layer in an oxygen ambient;
   providing first and second MOS gate structures on the gate dielectric layer, each MOS gate structure having a conductive body that acts as a gate electrode, an overlying insulation layer, vertical wall surfaces, and sidewall spacers overlying the vertical wall surfaces;
   selectively removing the sidewall spacers from the first MOS gate structure; and
   selectively oxidizing the first MOS gate structure to form a thick oxide layer partially underlying the conductive body at the wall surface, and leaving a portion of the gate dielectric layer underlying a central portion of the first MOS gate structure un-oxidized.

6. The process of claim 5, wherein the step of selectively removing comprises:
   applying a photoresist mask covering the second MOS gate structure; and
   etching away the sidewall spacer that lies adjacent to the first MOS gate structure.

7. The process of claim 5 further comprising the step of forming a doped region in the substrate intermediate to the first and second MOS gate structures.

8. A process for fabricating a semiconductor device comprising the steps of:
   providing a semiconductor substrate having a gate dielectric layer thereon;
   forming a first and second conductive body on the gate dielectric layer, each conductive body having a wall surface;
   forming a doped region in the substrate intermediate to the first and second conductive bodies;
   forming sidewall spacers adjacent to the first and second conductive bodies;
   forming an epitaxial layer intermediate to the first and second conductive bodies;
   selectively removing the sidewall spacer on the first conductive body; and
   selectively oxidizing the first conductive body to form an oxide layer partially underlying the first conductive body at the wall surface, and leaving a portion of the gate dielectric layer underlying a central portion of the first conductive body.

9. The process of claim 8, wherein the step of forming an epitaxial layer comprises:
   removing the gate dielectric layer intermediate to the first and second conductive bodies to expose the semiconductor substrate;
   epitaxially growing a layer of semiconductor material; and
   oxidizing the semiconductor material to from an oxide layer overlying the surface of the semiconductor material.

* * * * *